United States Patent
Tsai et al.

(10) Patent No.: US 6,484,113 B1
(45) Date of Patent: Nov. 19, 2002

(54) CONTAINER INSPECTION SYSTEM AND METHOD OF USING IN SEMICONDUCTOR MANUFACTURING

(75) Inventors: Yuh-Dean Tsai, Ping-Tung (TW); Li-Ren Lin, Hsin-Chu (TW); Chen-Chieh Lan, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/325,612

(22) Filed: Jun. 3, 1999

(51) Int. Cl.[7] .......................... G01N 37/00; G06F 19/00
(52) U.S. Cl. ........................................ 702/84; 700/115
(58) Field of Search ............................... 702/84, 81, 82; 700/115, 116, 121; 392/374; 226/110; 361/777

(56) References Cited

U.S. PATENT DOCUMENTS

| | | | | |
|---|---|---|---|---|
| 5,283,943 A | * | 2/1994 | Aguayo et al. | 29/701 |
| 5,325,305 A | * | 6/1994 | Rezaei | 700/114 |
| 5,796,616 A | * | 8/1998 | Hamuro et al. | 700/121 |
| 5,828,989 A | * | 10/1998 | Zvonar et al. | 702/188 |
| 5,930,140 A | * | 7/1999 | Asai et al. | 700/121 |
| 6,195,618 B1 | * | 2/2001 | Rosenberg et al. | 702/152 |
| 6,259,056 B1 | * | 7/2001 | Cowden | 219/121.69 |
| 6,259,966 B1 | * | 7/2001 | Izumida et al. | 700/229 |

\* cited by examiner

*Primary Examiner*—John S. Hilten
*Assistant Examiner*—Demetrius R. Pretlow
(74) *Attorney, Agent, or Firm*—Tung & Associates

(57) ABSTRACT

An automatic inspecting system for detecting the presence of and identifying whether the proper replacement container has been installed at a work station in a processing line, which automatic container checking system is capable of reading identifying information on the container, e.g., a bar-code, and comparing the information read with stored information indicative of a desired identification to determine whether there is a match. In the absence of a match, an alarm or other means can be used, by way of notification of a problem or to automatically stop the processing line.

20 Claims, 2 Drawing Sheets

CONTAINER INSPECTION SYSTEM AND METHOD OF USING IN SEMICONDUCTOR MANUFACTURING

BACKGROUND OF THE INVENTION

1. Field of the Invention

The present invention relates generally to a system and method for inspecting replacement components in a processing line, and more particularly to a checking system for sensing the presence of and identifying whether the proper replacement component has been installed at a work station to ensure better process reliability.

2. Prior Art

In processing lines, such as those for semiconductor fabrication, various components are used at work stations in the line that contain exhaustible supplies of processing materials, such as photo-resist in the case of the semiconductor fabrication line. When, frequently during the process, it is time to replace a container in which the material has become exhausted with a container having a new supply, it is important that the replacement container be properly placed at the station and that it actually hold the appropriate material intended for the process. As the replacement operation is subject to human error, incidents have occurred where due to a faulty installation or of the installing of a container with the wrong material, large amounts of process product has been contaminated and lost.

3. Problem to be Solved

It is therefore a problem in the art to ensure that a replacement component in a processing line is the proper one and properly installed for the process being carried out.

OBJECTS

It is accordingly an object of the present invention to provide a a system and method for reliably inspecting replacement components in a processing line.

It is another object of the invention to provide an automatic checking system for sensing the presence of and identifying whether the proper replacement component has been installed at a work station in a processing line to ensure better process reliability.

It is also a particular object of the invention to provide a method and means for confirming that a replacement container with a new supply of photo-resist is the intended one for use in a semiconductor fabrication line in which it is installed.

SUMMARY OF THE INVENTION

The present invention involves an inspecting system for detecting the presence of and identifying whether the proper replacement component has been installed at a work station in a processing line, and particularly an exemplary automatic container checking system which is capable of reading identifying information on the container indicative of a characteristic thereof and comparing the information read with stored information indicative of a desired characteristic to determine whether there is a match. In the absence of a match, an alarm or other means can be used, by way of notification of a problem or to automatically stop the processing line.

In a preferred embodiment, the container is provided with a suitable detectable marker, such as a label marked with chracteristic identifying information, e.g., a bar-code, or a color, or with a magnetic card, indicating the type or contents of the container, and, if desired, positioning information to indicate a proper location and/or orientation. The container is mounted in position on a machine or other support for supplying material, such as photo-resist, for use in a semiconductor fabrication process. A sensing device, e.g., a bar-code reader or magnetic card, is provided for reading the label information and communicating it to a control device such as a computer, which has an associated memory including a suitable database that is pre-loaded with selected identification information in keeping with the contents and position appropriate for the station at which the sensing device is disposed. The machine or processing line is normally inactive when a replacement container, filled with photo-resist, is placed in position at the station. If the contents and/or the position information detected on the label matches the selected related information stored in the database, when the machine and line are actuated, the processing will continue. If there is a mismatch, an alarm may be set off, or the machine or line automatically stopped by a signal from the computer, to permit a close inspection of the container and removal, if appropriate, to avoid contamination and loss of the processed product, e.g., scrapping of a considerable number of valuable semiconductor wafers. Accordingly, the invention by sensing the presence of and identifying whether the proper replacement component has been installed at a work station in a processing line and by stopping the processing when appropriate, ensures better process reliability and increased product yield rate.

BRIEF DESCRIPTION OF THE DRAWINGS

The present invention will be described in more detail below with reference to the accompanying drawings in which.

DETAILED DESCRIPTION OF THE PREFERRED EMBODIMENT

Figure 1:
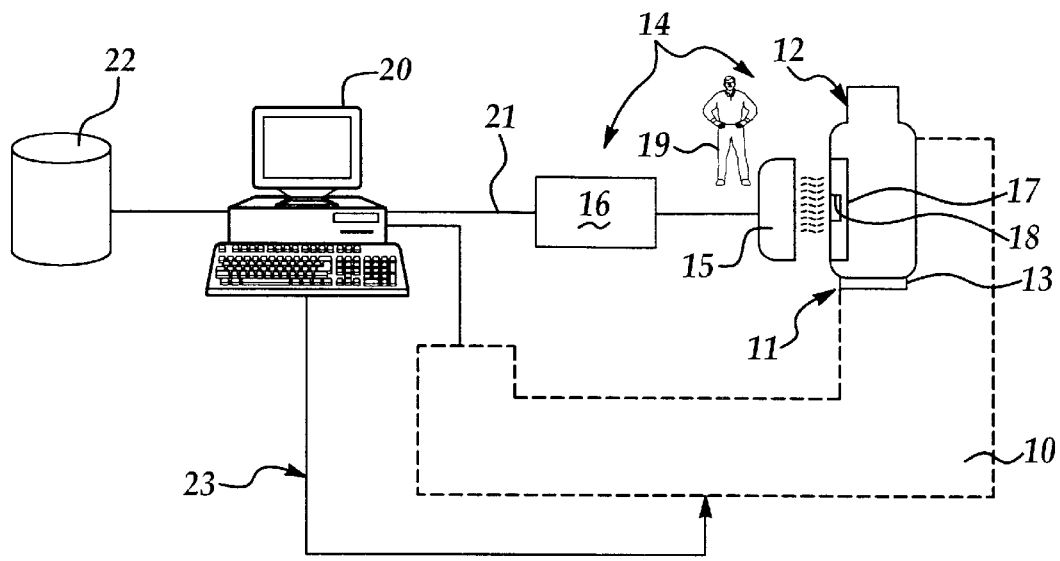
FIG. 1 is a diagrammatic illustration of an inspecting system in accordance with the present invention.

The present invention is directed to providing a system and method for inspecting replacement components in processing lines for their appropriateness, such as proper contents, type, or location or orientation. As seen in FIG. 1, a preferred embodiment of an inspecting system in accordance with the invention for checking replacement containers involves a processing machine 10, e.g., for fabricating semiconductor wafers, and a position at a workstation 11 with a suitable support structure 13 for holding a replaceable container 12 with a supply of processing material, such as photo-resist, to be dispensed in carrying out the fabrication process. Each time the container 12 is emptied of processing material, another container filled with the same processing material must be substituted at the station 11 to continue the process. The substitution is normally carried out by a machine operator 19 who places the container 12 by hand in the support structure 13 at the workstation. Consequently, the chance that the container 12 may be improperly mounted on the support structure 13, or that a container filled with the wrong processing material may be inadvertently placed at the workstation 11, is always possible. To avoid such processing hazards, a detector assembly 14, including an identification sensor 15 and a proximate or remote device driver 16, is arranged with the sensor 15 adjacent to the work station 11 in a position to read identifying information on the container 12. Accordingly, identifying information, such as on a bar-code 18 marked on a label 17, identifying the container's contents, may be disposed in a position on the side of the container 12 where it can be readily viewed by the identification sensor 15, which sensor may consist of a source of illumination for illuminating the bar-code 18 and a radiation detector or reader for detecting illumination reflected by the bar-code 18. The label 17 may alternatively, or also, be provided with markings that indicate the type, or a proper positioning, of the container 12 in the support structure 13. The detector in the identification sensor 15 may provide the sensed bar-code information through the driver 16 and a transmission line 21 to a utilization or control device such as a computer 20. The transmission line 21 may be in the form of a keyboard input, in the event that the computer 20 is locally disposed, or over a phone line and RS232 interface and modem, if the computer 20 is to be remotely located from the machine 10. The driver 16 and computer 20 can be proximately or remotely located with respect to each other to suit any processing installation.

To verify that the position, type, and/or content information received by the computer 20 accurately conforms to the proper intended information, the computer 20 may be provided with or coupled to a memory or database 22 in which the proper intended information is preselected and stored. Upon receipt of the position, type, or content information transmitted from the container 12 mounted at the station 11, the received information is compared with the stored information to sense a match. If the contents, type, and/or the position information detected on the label 18 matches the related information stored in the database 22, the machine 10 and process line, after activation, will continue the processing. If there is a mismatch, an alarm may be set off and/or the machine 10 or process line automatically stopped, e.g., by a signal 23 from the computer 20, to permit a close inspection of the container 12 and its removal, if appropriate, to avoid contamination and loss of the processed product, e.g., scrapping of a considerable number of valuable semiconductor wafers. The system may be used to check the container each time the machine or process is activated.

Figure 2:
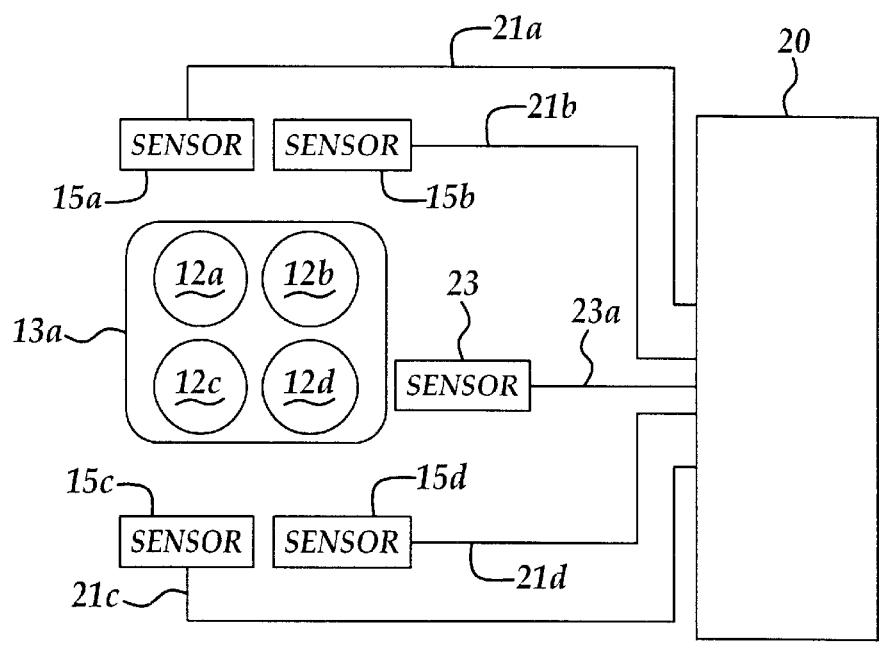
FIG. 2 is a plan view of a processing station installation of an embodiment of the system of FIG. 1.

An embodiment utilizing a number of information detecting sensors for inspecting more than one container at a single workstation is shown in FIG. 2. Four dispensing containers 12a, 12b, 12c, and 12d, are disposed adjacent each other in quadrature positions on a support 13a at a workstation 11a. Four bar-code label detector sensors 15a, 15b, 15c, and 15d, are respectively located adjacent the four containers 12a, 12b, 12c, and 12d, on opposite sides of the container support 13a for detecting the information on the content labels. One or more position sensors 23 (one shown for clarity) may be located respectively adjacent the four containers on the other opposite sides of the container support 13a for detecting appropriate position information on each of the containers 12a, 12b, 12c, and 12d, or their presence or proper orientation. The leads or transmission lines 21a, 21b, 21c, 21d, and 23d from each of the sensors couple the signals, indicative of the respective sensed information, from the detector devices to the computer 20, which can be used to compare the sensed information respectively with the preselected stored information to determine if all of the signals contain sensed information providing a match. If there is a match, the machine and line when actuated will continue the processing. If any one of the sensed signals results in a mismatch, the machine and line may be automatically shut down immediately.

Figure 3:
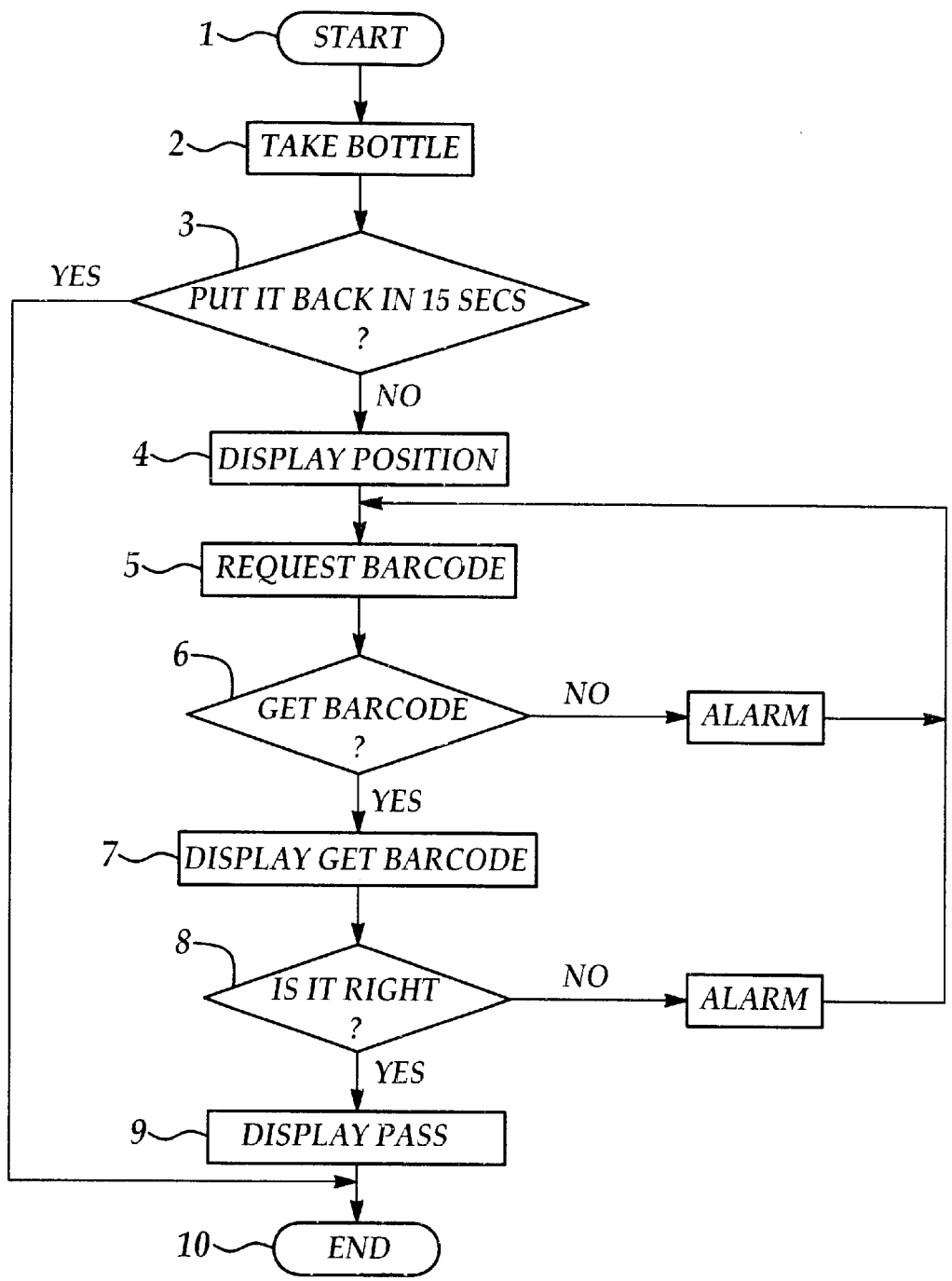
FIG. 3 is a flowchart of the inspection process performed by the inspecting system in accordance with the present invention.

A flowchart of the inspecting system's automatic operation is shown in FIG. 3. The first step 1 in the operation is to start the process, which may be triggered by a start signal from the computer. Then in step 2, a machine operator takes an empty replaceable container or bottle out of the support and replaces it with a full container in set time, e.g., 15 seconds, in step 3. The checking system is then activated and the position of the container is checked using the preselected stored information as described above. If the container is properly positioned, a YES signal is sent to cause the position checking to be ended and the process continues. The container identification checking process is then begun in step 4 by displaying the position of the container to be checked. An activating signal, e.g., from the control computer, in step 5 requests the identification sensor to illuminate the bar-code on the container and the radiation detector or reader in step 6 checks to determine whether the bar-code has been detected. If the bar-code is not detected, a No signal is issued activating an alarm to stop the process and setting the checking system back to begin at step 4 when the process is restarted. If the bar-code is detected, a YES signal is issued to cause the bar-code information to be displayed in step 7. Then, the bar-code identification information is compared with the preselected stored identification information in step 8 to check for a match to determine whether the container is the right one. If there is no match, a NO signal is issued to activate an alarm to stop the process, and reset the system to step 4 upon resumption after the container has been inspected and replaced. If there is a match indicating that the container is the right one, a YES signal is issued to display a PASS in step 9 and allow the process to continue while ending the checking procedure in step 10. The foregoing procedure can be run for each container at a work station, and when any container is replaced.

It will therefore be seen that an inspecting system and procedure are provided which, by sensing the presence of and identifying whether a replacement component with the proper characteristics has been installed at a work station in a processing line and by stopping the processing when the component does not have a preselected chracteristic, ensures better process reliability and increased product yield rate.

While the present invention has been described in terms of specific embodiments and combinations, it will be appreciated that the invention is not limited to the particular examples presented herein, and that the scope of the protection is defined in the attached claims.

What is claimed is:

1. An inspecting system for detecting a proper replacement component installed at a work station on a processing line, comprising:

means for holding a replacement component at a predetermined installation position at said work station on said processing line;

means, disposed on said component, including information for indicating a characteristic thereof;

means for checking the characteristic indicative information on said component and producing an information signal indicative of said characteristic;

means for storing information indicative of the proper characteristic of said component;

means for receiving said information signal and comparing the characteristic of which it is indicative with said stored information to check whether the characteristic of the replacement component conforms to the proper characteristics; and means, responsive to the results of said comparing, for producing a signal indicative of whether the characteristic of the replacement component conforms to the proper characteristic.

2. An inspecting system as in claim 1 wherein said component is a container and said characteristic is the contents of said container.

3. An inspecting system as in claim 1 wherein said means disposed on said component including information for indicating a characteristic comprises a label.

4. An inspecting system as in claim 1 wherein said processing line comprises a semiconductor fabrication line and said component comprises a container of photo-resist.

5. An inspecting system as in claim 1 wherein said means for storing information comprises a database.

6. An inspecting system as in claim 1 wherein said means for receiving said information signal and comparing the characteristic of which it is indicative with said stored information and said means for producing a signal indicative of whether the characteristic of the replacement component conforms to the proper characteristic comprise a computer.

7. An inspection method for detecting a proper replacement component installed at a work station on a processing line, comprising the steps of:

placing a replacement component at a predetermined installation position at said work station on said processing line;

disposing information on said component for indicating a characteristic thereof;

checking the characteristic indicative information on said component and producing an information signal indicative of said characteristic;

storing information indicative of the proper characteristic of said component;

receiving said information signal and comparing it with said stored information to check whether the characteristic of the replacement component conforms to the proper characteristic; and responsive to the results of said comparing, producing a signal indicative of whether the characteristic of the replacement component conforms to the proper characteristic.

8. An inspection method as in claim 7 wherein said component is a container and said characteristic is the contents of said container.

9. An inspection method as in claim 7 wherein said information disposed on said component comprises a barcode.

10. An inspection method as in claim 7 wherein said processing line comprises a semiconductor fabrication line and said component comprises a container of photo-resist.

11. An inspection method as in claim 7 wherein said step of storing information comprises storing preselected information in a database.

12. An inspection method as in claim 7 wherein the step of receiving said information signal and comparing said stored information and the step of producing a signal indicative of whether the characteristic of the replacement component conforms to the proper characteristic are performed with a computer.

13. An inspection method as in claim 7 wherein said information disposed on said component comprises a color.

14. An inspection method as in claim 7 wherein said information disposed on said component is on a label.

15. An inspecting system as in claim 1 wherein said means disposed on said component including information for indicating a characteristic comprises a bar-code.

16. An inspecting system as in claim 1 wherein said means disposed on said component including information for indicating a characteristic comprises a color.

17. An inspecting system as in claim 1 wherein said information for indicating a characteristic disposed on said component comprises positioning information.

18. An inspecting system as in claim 1 further comprising means, responsive to the signal indicative of whether the characteristic of the replacement component conforms to the proper characteristic, for producing an alarm signal when the indication is of nonconformance.

19. An inspection method as in claim 10 wherein said information disposed on said component comprises positioning information.

20. An inspection method as in claim 10 further comprising the step of producing an alarm signal when the signal indicative of whether the characteristic of the replacement component conforms to the proper characteristic, indicates nonconformance.

* * * * *